United States Patent
Yoshikawa et al.

(10) Patent No.: US 10,332,958 B2
(45) Date of Patent: Jun. 25, 2019

(54) SUPPORTING SUBSTRATE FOR COMPOSITE SUBSTRATE AND COMPOSITE SUBSTRATE

(71) Applicant: NGK Insulators, Ltd., Nagoya (JP)

(72) Inventors: Jun Yoshikawa, Nagoya (JP); Mikiya Ichimura, Ichinomiya (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/925,095

(22) Filed: Oct. 28, 2015

(65) Prior Publication Data

US 2016/0049469 A1 Feb. 18, 2016

Related U.S. Application Data

(63) Continuation of application No. PCT/JP2014/063378, filed on May 20, 2014.

(30) Foreign Application Priority Data

May 31, 2013 (JP) .................. 2013-115308

(51) Int. Cl.
*H01L 29/06* (2006.01)
*C04B 35/111* (2006.01)
(Continued)

(52) U.S. Cl.
CPC .......... *H01L 29/0649* (2013.01); *B32B 5/022* (2013.01); *B32B 5/18* (2013.01);
(Continued)

(58) Field of Classification Search
CPC ..... H01L 29/0649; H01L 29/16; H01L 41/08; H01L 41/081; H01L 41/312;
(Continued)

(56) References Cited

U.S. PATENT DOCUMENTS 6,093,338 A * 7/2000 Tani ................... C04B 35/462
                                                  252/62.9 PZ
7,911,111 B2 * 3/2011 Suzuki ..................... H03H 3/10
                                                  310/313 R
(Continued)

FOREIGN PATENT DOCUMENTS

JP 08-018387 A 1/1996
JP 2002-111210 A1 4/2002
(Continued)

OTHER PUBLICATIONS

English Translation of Yoshitake et al. (JP2002-121066) provided by the Espacenet website, internet retrieval deate of Jul. 17, 2017.*
(Continued)

*Primary Examiner* — Jonathan C Langman
(74) *Attorney, Agent, or Firm* — Burr & Brown, PLLC

(57) ABSTRACT

A supporting substrate for a composite substrate comprises a ceramic and has a polished surface for use in bonding. An orientation degree of the ceramic forming the supporting substrate at the polished surface is 50% or higher, and an aspect ratio of each crystal grain included in the supporting substrate is 5.0 or less.

11 Claims, 7 Drawing Sheets

US 10,332,958 B2
Page 2

(51) Int. Cl.
| | | |
|---|---|---|
| H01L 29/20 | (2006.01) | |
| B32B 9/04 | (2006.01) | |
| C04B 35/453 | (2006.01) | |
| C04B 37/00 | (2006.01) | |
| H03H 9/02 | (2006.01) | |
| B32B 9/00 | (2006.01) | |
| H01L 29/16 | (2006.01) | |
| H01L 41/08 | (2006.01) | |
| B32B 7/12 | (2006.01) | |
| B32B 5/02 | (2006.01) | |
| B32B 5/18 | (2006.01) | |
| B32B 15/04 | (2006.01) | |
| B32B 15/20 | (2006.01) | |
| H01L 41/312 | (2013.01) | |
| H01L 41/313 | (2013.01) | |
| H01L 33/00 | (2010.01) | |

(52) U.S. Cl.
CPC ............... *B32B 7/12* (2013.01); *B32B 9/005* (2013.01); *B32B 9/04* (2013.01); *B32B 15/04* (2013.01); *B32B 15/20* (2013.01); *C04B 35/111* (2013.01); *C04B 35/453* (2013.01); *C04B 37/00* (2013.01); *C04B 37/001* (2013.01); *C04B 37/005* (2013.01); *C04B 37/008* (2013.01); *H01L 29/16* (2013.01); *H01L 41/08* (2013.01); *H01L 41/081* (2013.01); *H01L 41/312* (2013.01); *H01L 41/313* (2013.01); *H03H 9/02566* (2013.01); *H03H 9/02574* (2013.01); *H03H 9/02834* (2013.01); *B32B 2260/021* (2013.01); *B32B 2260/046* (2013.01); *B32B 2262/0246* (2013.01); *B32B 2262/0253* (2013.01); *B32B 2262/0261* (2013.01); *B32B 2262/0276* (2013.01); *B32B 2266/0278* (2013.01); *B32B 2457/00* (2013.01); *B32B 2457/14* (2013.01); *C04B 2235/5445* (2013.01); *C04B 2235/6025* (2013.01); *C04B 2235/786* (2013.01); *C04B 2235/963* (2013.01); *C04B 2237/062* (2013.01); *C04B 2237/064* (2013.01); *C04B 2237/08* (2013.01); *C04B 2237/30* (2013.01); *C04B 2237/34* (2013.01); *C04B 2237/341* (2013.01); *C04B 2237/343* (2013.01); *C04B 2237/36* (2013.01); *C04B 2237/52* (2013.01); *H01L 29/2003* (2013.01); *H01L 33/007* (2013.01)

(58) Field of Classification Search
CPC . H01L 41/313; H01L 29/2003; H01L 33/007; B32B 5/022; B32B 5/18; B32B 7/12; B32B 9/005; B32B 9/04; B32B 15/04; B32B 15/20; B32B 2260/021; B32B 2260/046; B32B 2262/0246; B32B 2262/0253; B32B 2262/0261; B32B 2262/0276; B32B 2266/0278; B32B 2457/00; B32B 2457/14; C04B 35/111; C04B 35/453; C04B 37/00; C04B 37/001; C04B 37/005; C04B 37/008; C04B 2235/6025; C04B 2235/786; C04B 2235/963; C04B 2237/062; C04B 2237/064; C04B 2237/08; C04B 2237/30; C04B 2237/34; C04B 2237/341; C04B 2237/343; C04B 2237/36; C04B 2237/52; H03H 9/02566; H03H 9/02574; H03H 9/02834

See application file for complete search history.

(56) References Cited

U.S. PATENT DOCUMENTS

| | | | |
|---|---|---|---|
| 8,158,255 B2 | 4/2012 | Yokoyama et al. | |
| 8,367,205 B2 | 2/2013 | Yura et al. | |
| 2001/0044371 A1* | 11/2001 | Hirako | C04B 35/10 501/127 |
| 2002/0045531 A1* | 4/2002 | Suzuki | B82Y 30/00 501/98.4 |
| 2003/0153163 A1 | 8/2003 | Letertre et al. | |
| 2007/0159028 A1* | 7/2007 | Nagaya | C01G 33/00 310/358 |
| 2007/0259468 A1* | 11/2007 | Chen | H01L 41/337 438/48 |
| 2010/0119800 A1* | 5/2010 | Yokoyama | C04B 35/475 428/220 |
| 2010/0141099 A1* | 6/2010 | Suenaga | H01L 41/047 310/365 |
| 2010/0244182 A1* | 9/2010 | Akiyama | H01L 21/76254 257/506 |
| 2011/0012478 A1* | 1/2011 | Najafi | B81C 1/0019 310/334 |
| 2011/0227068 A1* | 9/2011 | Akiyama | H01L 21/76254 257/43 |
| 2012/0001223 A1 | 1/2012 | Inoue et al. | |

FOREIGN PATENT DOCUMENTS

| | | |
|---|---|---|
| JP | 2002-121066 A | 4/2002 |
| JP | 2002-128564 A | 5/2002 |
| JP | 2003-224042 A | 8/2003 |
| JP | 3556886 B | 8/2004 |
| JP | 2009-046376 A1 | 3/2009 |
| JP | 2010-018510 A | 1/2010 |
| JP | 2010-056435 A | 3/2010 |
| JP | 4657002 B2 | 3/2011 |
| JP | 2011-146652 A | 7/2011 |
| WO | 2011/083551 A1 | 7/2011 |

OTHER PUBLICATIONS

A. Zaki, H. Elsimary, Mona Zaghloul, "Miniature SAW device for RFWireless Applications Using MEMS Technology", Proceedings of the 5th WSEAS Int. Conf. on Circuits, Systems, Electronics, Control & Signal Processing, Dallas, USA, Nov. 1-3, 2006. (Year: 2006).*
English Translation of International Preliminary Report on Patentability, International Application No. PCT/JP2014/063378, dated Dec. 10, 2015 (7 pages).
International Search Report (with English Translation), International Application No. PCT/JP2014/063378, dated Aug. 5, 2014 (7 pages).
German Examination Report (with English translation), German Application No. 11 2014 002 593.3, dated Jan. 23, 2018 (7 pages).
Japanese Office Action (Application No. 2015-519801) dated Mar. 5, 2018 (with English translation).

* cited by examiner

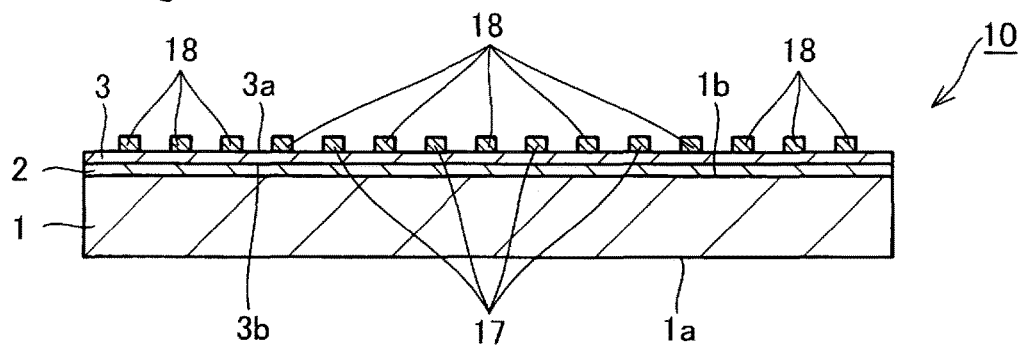
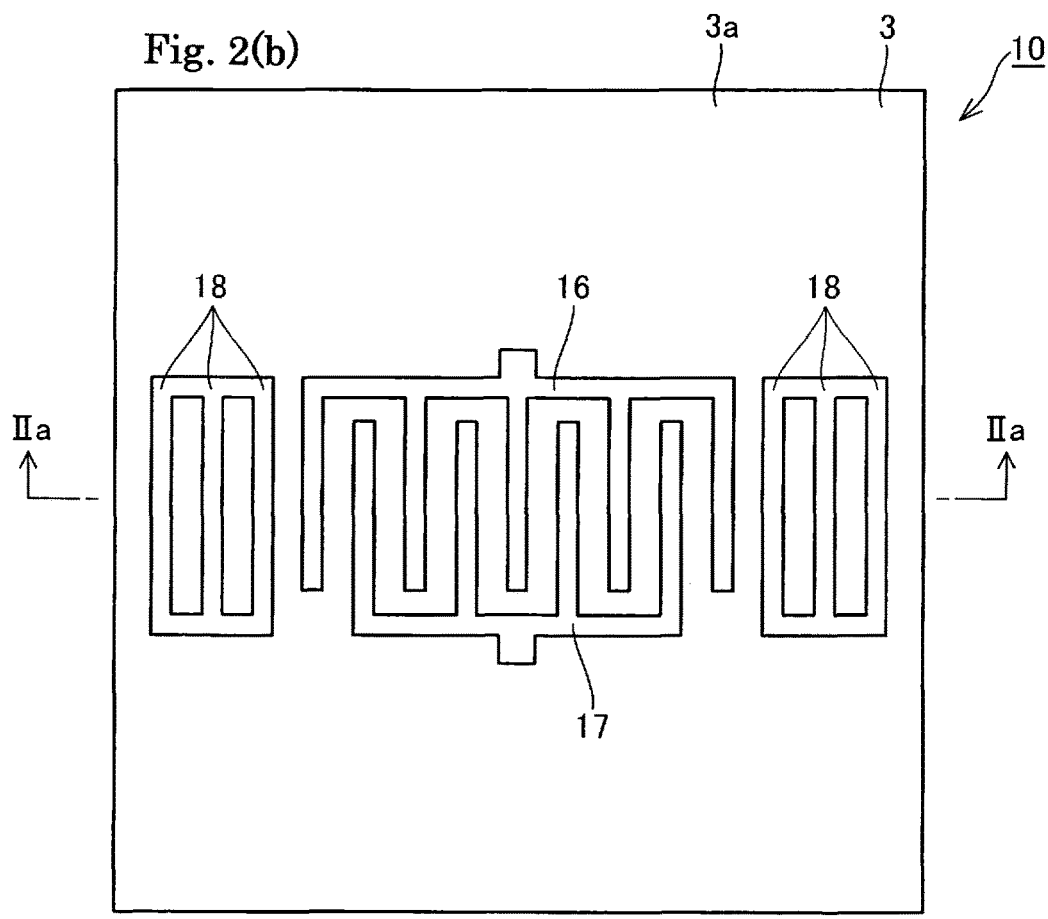

US 10,332,958 B2

SUPPORTING SUBSTRATE FOR COMPOSITE SUBSTRATE AND COMPOSITE SUBSTRATE

TECHNICAL FIELD

The present invention relates to a supporting substrate for a composite substrate that bonds and supports a functional layer, such as a piezoelectric body or a semiconductor.

BACKGROUND ART

Surface acoustic wave elements are widely used as bandpass filters in communication devices, such as mobile phones. With the higher performance of mobile phones and the like, filters using the surface acoustic wave elements are also required to have higher performance.

The surface acoustic wave elements, however, have a problem of shifting the passband because of changes in temperature. In particular, for example, lithium niobate and lithium tantalate, which are currently used in many cases, have a large electromechanical coupling factor, so that this is very advantageous to achieve broadband filter characteristics. However, both the lithium niobate and lithium tantalate have poor temperature stability.

For example, the temperature coefficient of the change in frequency of the surface acoustic wave filter using lithium tantalate is −35 ppm/° C., which means that variations in frequency in the assumed operating temperature range are large. Thus, it is necessary to reduce the temperature coefficient of the change in frequency.

To fabricate an acoustic wave element having excellent frequency temperature characteristics, it is known to utilize a composite substrate that is produced by bonding a functional substrate made of a piezoelectric material or the like to a supporting substrate made of material exhibiting low thermal expansion (as disclosed in Patent Document 1).

On the other hand, in fabricating a light-emitting element using a nitride-based compound semiconductor, such as GaN, a method is proposed in order to reduce the amount of use of a substrate made of expensive GaN-based semiconductor. The method is known that involves bonding a GaN-based semiconductor substrate to a supporting substrate made of a different material (e.g., ZnO, $\beta$-$Ga_2O_3$), and then separating most of the semiconductor substrate from the supporting substrate while leaving only a thin layer of the GaN-based semiconductor on the supporting substrate (see Patent Document 3).

In antenna selector switches for use in mobile phones, a silicon on sapphire (SOS) technique has recently attracted attention, in terms of the multimode and multiband as well as reduction in size and cost. This technique involves epitaxially growing Si on a sapphire substrate and forming a CMOS switch by using the Si layer. A feature of the technique is that the use of the insulating sapphire suppresses current leakage to the substrate, and thus is very effective in reducing power consumption. Such a technique is similar to the Si platform technology, enabling integration of a decoder circuit, etc., on one chip, and hence is very advantageous in terms of downsizing and cost reduction. On the other hand, the technique described above sometimes results in degradation of the quality of the Si layer because of the use of a single-crystal sapphire substrate having a different lattice constant from that of Si to epitaxially grow Si on the sapphire substrate. To suppress this phenomenon, a substrate including a single-crystal Si (functional substrate) bonded to a sapphire substrate (supporting substrate) has been studied (as disclosed in Patent Document 4).

The functional substrate and the supporting substrate are bonded together directly or via a bonding layer or an adhesive layer. In either case, to maximize the bonding strength, it is necessary to planarize the surface of the substrate by the chemical-mechanical planarization (CMP) or the like.

CITATION LIST

Patent Literature

Patent literature 1: Japanese Patent No. 4657002B
Patent literature 2: Japanese Patent Publication No. 2010-018510A
Patent literature 3: Japanese Patent Publication No. 2011-146652A
Patent literature 4: Japanese Patent Publication No. 2003-224042A
Patent literature 5: Japanese Patent No. 3556886B

SUMMARY OF THE INVENTION

In general, single-crystal material is used for the supporting substrate, because it can relatively easily achieve a high surface flatness, but has a problem of high cost. Further, a single crystal does not have enough strength, and thus tends to cause the problem with cracks in processing, including polishing and cutting.

An object of the present invention is to provide a supporting substrate for a composite substrate with a polished surface for use in bonding, that can prevent generation of cracks which tend to occur in processing a single crystal, while ensuring the high accuracy of the processed surface.

The present invention provides a supporting substrate for a composite substrate, the supporting substrate comprising a ceramic and having a polished surface for use in bonding. An orientation degree of the ceramic at the polished surface is 50% or more, and an aspect ratio of crystal grains forming the supporting substrate is 5.0 or less.

The inventors have studied that a supporting substrate for a composite substrate is formed using ceramic which has a high strength and is less likely to generate cracks. However, conventional ceramic materials have a polycrystalline structure, which makes it difficult to highly improve the flatness of the polished surface of a single crystal, or degrades the flatness of the processed surface because of falling of grains in processing.

Here, the inventors have arrived at the use of an oriented ceramic in the supporting substrate for a composite substrate. The oriented ceramic is controlled to have crystal grains of the ceramic oriented in a predetermined direction. That is, the inventors have found that by orienting the bonding surface (polished surface) of the supporting substrate, the surface accuracy can be improved to a degree comparable with a single crystal in polishing while preventing the occurrence of cracks. The present invention has been made based on these findings. Thus, the present invention can drastically improve the productivity of the composite substrates, which has significant industrial applicability.

BRIEF DESCRIPTION OF DRAWINGS

FIG. 2(a) is a cross-sectional view schematically showing another surface acoustic wave element 10, and FIG. 2(b) is a top view schematically showing the element 10 illustrated in FIG. 2(a). FIG. 2(a) corresponds to a section taken along the line IIa-IIa of FIG. 2(b).

Figure 1A:
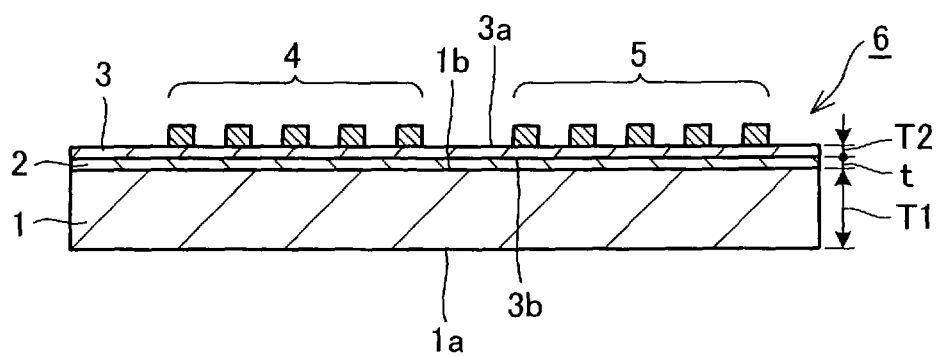
FIG. 1(a) corresponds to a section taken along the line Ia-Ia of FIG. 1(b).

DETAILED DESCRIPTION OF THE INVENTION (Supporting Substrate)

In the invention, ceramic material with a crystal face oriented in a specific direction is used as a supporting substrate for a composite substrate. This arrangement can ensure the excellent accuracy of a processed surface comparable with that of a single crystal, and can also prevent the occurrence of cracks that would otherwise be easily generated in processing a single crystal.

The term "orientation degree of a polished surface of the supporting substrate" as used herein means the orientation degree calculated by the Lotgering method, that is, an index indicative of the orientation of crystal grains included in a ceramic, as described in Patent Document 2 (Japanese Unexamined Patent Application Publication No. 2010-018510A). This can be measured by a method described in the following Examples.

The orientation degree of the polished surface of the supporting substrate can be set to 50% or more, thereby sufficiently enhancing the surface flatness of the processed surface. From this viewpoint, the orientation degree of the polished surface of the supporting surface is preferably 60% or more, and more preferably 70% or more. In this regard, the upper limit of the orientation degree of the polished surface of the supporting substrate is not specifically limited, but is practically preferably 98% or less in terms of the easiness of manufacturing.

In the invention, an aspect ratio of a crystal grain (a ratio of its length in the direction parallel to the polished surface/ its length in the direction perpendicular to the polished surface), which is determined by observation of the section of the supporting substrate, is 5.0 or less. This can prevent falling of the grains in processing the surface, ensuring the good condition of the processed surface. This is supposed to be because by decreasing the aspect ratio, regarding grains existing at the surface, a ratio of the area of the grain exposed at the processed surface of the substrate to the whole volume of the grain becomes lower, whereby the grains are less likely to be peeled off and fall out of the grain boundaries during the processing. From this viewpoint, the above-mentioned aspect ratio is preferably 3.0 or less, and more preferably 2.5 or less. This aspect ratio can be measured by a method described in the following Examples.

The above-mentioned aspect ratio is preferably 1.0 or more, more preferably 1.1 or more, and most preferably 1.2 or more.

An average crystal grain size of the ceramic included in the supporting substrate is preferably 100 µm or less. This can improve the strength of the substrate, and can effectively suppress the cracks in processing. In this regard, the average crystal grain size of the ceramic included in the supporting substrate is more preferably 80 µm or less.

On the other hand, the average crystal grain size of the ceramic included in the supporting substrate is preferably 2 µm or more. This can suppress falling of the grains when processing the surface of the substrate. The reason for this is not clear, but seems to be that as the grain size is increased to a certain level or more, the energy required for one grain to fall is also increased. From this point of view, the average crystal grain size of the ceramic included in the supporting substrate is more preferably 4 µm or more.

Suitable ceramic materials included in the supporting substrate can include, for example, alumina, silicon carbide, aluminum nitride, silicon nitride, cordierite, gallium oxide, and zinc oxide. In particular, alumina, cordierite, or zinc oxide is preferable because of its relatively low coefficient of thermal expansion.

In the case of material with polarity, such as zinc oxide, it is desirable that a non-polar face, such as an m-plane or an a-plane, is oriented, compared to a polar face, such as a c-plane. This is because the processing rate depends on the face polarity, and the non-polar face can improve its surface flatness further.

A relative density of the ceramic included in the supporting substrate is preferably 98% or higher, and more preferably 99% or higher, in terms of the surface flatness and prevention of contamination.

In application to a light-emitting element using GaN-based semiconductor, a volume resistivity of the ceramic included in the supporting substrate is preferably $1 \times 10^{-2}$ Ω·cm or less, and more preferably $2 \times 10^{-3}$ Ω·cm or less. This arrangement can employ a vertical structure that allows current to flow through the substrate, which can achieve the low cost and improve the luminous efficiency with simplification of the structure.

In application to the light-emitting element, the ceramic included in the supporting substrate preferably has translucency. Thus, the emitted light can be effectively taken out to the outside. To impart the translucency to the supporting substrate, not only the thinning of the supporting substrate, but also the use of a hot press method, a hot isostatic pressing method (HIP), or the like as a fabrication method is very effective for densification of ceramic while increasing the grain size of the ceramic through the grain growth.

(Composite Substrate)

The composite substrate, that can be provided by the invention, includes the supporting substrate and a functional layer bonded to the polished surface of the supporting substrate directly or via a bonding layer. The functional layer includes a semiconductor, a piezoelectric material, or a dielectric material.

The functional layer is a layer comprised of the semiconductor, the piezoelectric material, or the dielectric material. The term "functional layer" as used herein means a layer bonded to the supporting substrate of the invention. The functional layer preferably takes the following forms.

(1) A self-sustainable functional substrate is bonded to the supporting substrate, and then the functional substrate is used without being processed thereafter.

(2) A self-sustainable functional substrate is bonded to the supporting substrate, and then the functional substrate is thinned. Such thinning processes can include, for example, polishing, grinding, partial peeling, etc.

(3) In the process (2), after bonding the self-sustainable functional substrate to the supporting substrate, the functional substrate is thinned into a thin layer having a thickness (e.g., of 1 μm or less) that cannot be self-sustained. Such thinning processes can include, for example, polishing, grinding, partial peeling, etc.

Examples of devices with the functions that can be provided by the composite substrate can include the following:

various sensors, such as an acceleration sensor, a pyroelectric sensor, an ultrasonic sensor, an electric field sensor, a temperature sensor, a gas sensor, a knocking sensor, a yaw rate sensor, an air bag sensor and a piezoelectric gyro sensor; energy conversion elements, such as a piezoelectric transformer; and low loss actuators or low loss resonators, such as a piezoelectric actuator, an ultrasonic motor and a resonator. Examples also include a capacitor, a bimorph piezoelectric element, a vibration pickup, a piezoelectric microphone, a piezoelectric ignition element, a sonar, a piezoelectric buzzer, a piezoelectric speaker, an oscillator, a filter, a dielectric element, a microwave dielectric element, a thermoelectric conversion element, a pyroelectric element, a projector, a high-frequency device, a high-performance laser, a power device, a light-emitting element, a laser, a light receiving element, a solar cell and an antenna selector switch.

In one example of preferred embodiments, the functional layer is comprised of a piezoelectric single crystal, and is a propagation substrate that allows for propagation of acoustic wave. FIGS. 1 to 3 correspond to this embodiment.

Figure 1B:
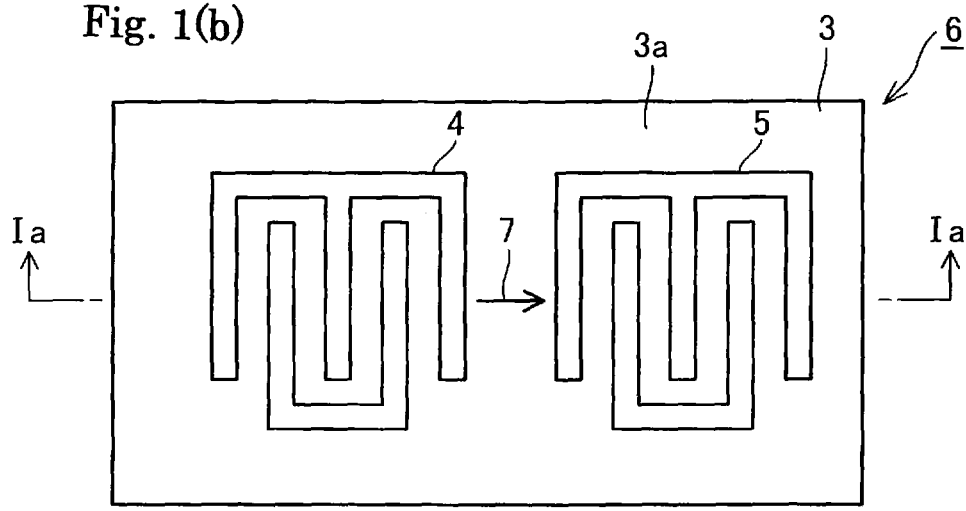
FIG. 1(*a*) is a cross-sectional view schematically showing a surface acoustic wave element 6, and FIG. 1(*b*) is a top view schematically showing the element 6 illustrated in FIG. 1(a).

In a surface acoustic wave element 6 shown in FIGS. 1(a) and 1(b), a bonding surface 3b of a propagation substrate 3 is bonded to a bonding surface 1b of a supporting substrate 1 via an adhesive layer 2. The supporting substrate 1 has a bottom surface 1a. An input electrode 4 and an output electrode 5 are formed at a surface 3a of the propagation substrate, which produces a transversal type surface acoustic wave element 6. A surface acoustic wave propagates from the input electrode 4 toward the output electrode 5 as indicated by an arrow 7, which configures a surface acoustic wave filter.

Most surface acoustic wave filters for mobile phones utilize a resonance type surface acoustic wave element. FIGS. 2(a) and 2(b) correspond to this example. FIG. 2(b) illustrates an example of an electrode pattern in the resonance type surface acoustic wave element.

Referring to FIGS. 2(a) and 2(b), in a surface acoustic wave element 10, the bonding surface 3b of the propagation substrate 3 is bonded to the bonding surface 1b of the supporting substrate 1 via the adhesive layer 2. The supporting substrate 1 has the bottom surface 1a. Electrodes 16, 17, and 18 are formed at the surface 3a of the propagation substrate, thereby producing the resonance type surface acoustic wave element.

Figure 3A:
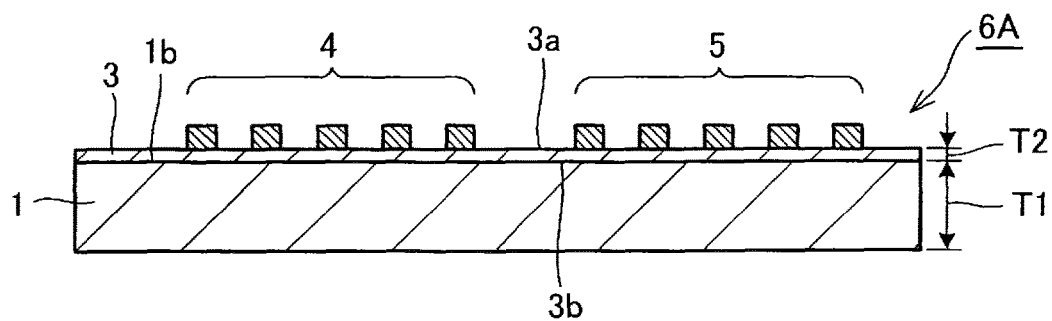
FIGS. 3(a) and 3(b) are cross-sectional views schematically showing still other surface acoustic wave elements 6A and 10A, respectively.

In a surface acoustic wave element 6A shown in FIG. 3(a), the bonding surface 3b of the propagation substrate 3 is directly bonded to the bonding surface 1b of the supporting substrate 1. The input electrode 4 and the output electrode 5 are formed at the surface 3a of the propagation substrate, which produces a transversal type surface acoustic wave element 6A. A surface acoustic wave propagates from the input electrode 4 toward the output electrode 5 as indicated by an arrow 7, which configures a surface acoustic wave filter.

Figure 3B:
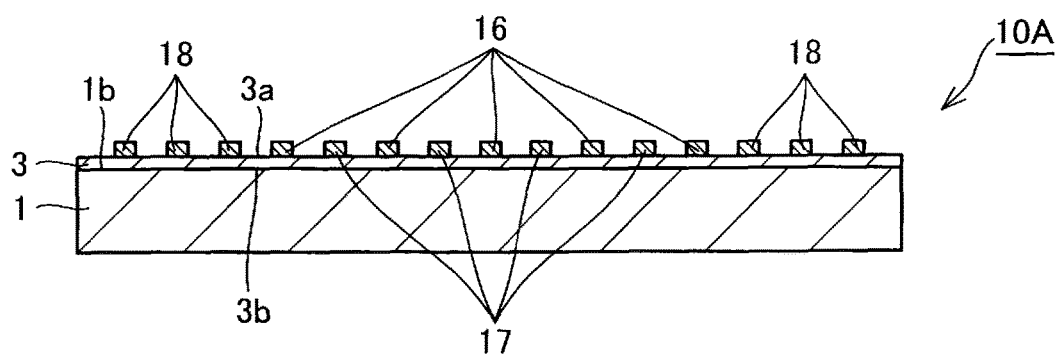

In a surface acoustic wave element 10A shown in FIG. 3(b), the bonding surface 3b of the propagation substrate 3 is directly bonded to the bonding surface 1b of the supporting substrate 1. The supporting substrate 1 has the bottom surface 1a. Electrodes 16, 17, and 18 are formed at the surface 3a of the propagation substrate, thereby producing the resonance type surface acoustic wave element.

The acoustic wave element may be an element using a lamb wave propagating through the propagation substrate, in addition to the surface acoustic wave. In particular, the acoustic wave element is preferably a surface acoustic wave filter or a resonator. The surface acoustic wave filter is preferably a bandpass filter. The resonator is a surface acoustic wave oscillation element, which includes both one-port type and two-port type.

The acoustic wave element may be the lamb wave resonator that includes an IDT electrode comprised of a plurality of electrode fingers provided at the surface of the propagation substrate, the electrode fingers being interdigitated to each other, and a pair of reflectors disposed on both sides of the IDT electrode in the propagation direction of the lamb wave. The lamb wave is a plate wave produced by allowing a bulk wave propagating through the inside of the substrate to be repeatedly reflected off the upper and lower surfaces of the substrate, which is obtained by thinning the substrate to a thickness of several wavelengths of the propagating wave or less. The lamb wave is the bulk wave propagating through the inside of the substrate, so that its energy is distributed across the whole substrate, unlike a surface wave, such as the Rayleigh wave having 90% of energy within a depth of one wavelength from the substrate surface, a leakage surface acoustic wave, and a pseudo longitudinal wave type leakage surface acoustic wave.

A thickness T1 of the supporting substrate is preferably 100 μm or more, further more preferably 150 μm or more, and most preferably 200 μm or more in terms of improving the temperature characteristics. The thickness T1 is preferably 500 μm or less in terms of downsizing of products. The process of the substrate into a desired thickness can be achieved by bonding the functional (propagation) substrate to the supporting substrate, and then performing rough polishing with a grinder or the like as well as precise polishing with colloidal silica, a urethane pad, etc.

Preferable materials for the propagation substrate can include an element selected from the group consisting of lithium niobate, lithium tantalate, and lithium niobate-lithium tantalate solid solution single crystal, as these elements have high electro-mechanical coupling factors. Preferably, the piezoelectric single crystal is comprised of lithium tantalate.

Further, preferably, the surface acoustic wave propagation direction in the propagation substrate is the X direction, and the propagation substrate has a cut angle of the rotated Y cut plate. In particular, preferably, the lithium niobate is comprised of a rotated Y cut plate having a cut angle of 35 to 130°. The lithium tantalate is comprised of a rotated Y cut plate having a cut angle of 36 to 47°.

A thickness T2 of the propagation substrate is preferably in a range of 10 to 50 μm, more preferably 10 to 40 μm, and most preferably 10 to 30 μm, in terms of improving the temperature characteristics for the frequency in use of the surface acoustic wave device. In the acoustic wave device using the lamb wave or a bulk acoustic wave, the thickness T2 of the propagation substrate is preferably in a range of 0.1 to 10 μm, and more preferably in a range of 0.1 to 1 μm.

In a preferred embodiment, a thickness t of the organic adhesive layer is set to not less than 0.1 μm nor more than 1.0 μm. The thickness of the organic adhesive layer is preferably 0.1 μm or more, and 0.8 μm or less in terms of further improving the temperature characteristics of the acoustic wave element for the frequency.

The material for the electrode pattern is preferably aluminum, an aluminum alloy, copper, or gold, and more preferably aluminum or an aluminum alloy. The aluminum alloy suitable for use preferably includes a mixture of Al and 0.3 to 5 wt. % of Cu. In this case, Ti, Mg, Ni, Mo, or Ta may be used in place of Cu.

A ratio (t/λ) of the thickness of the electrode pattern to the wavelength λ, of the acoustic wave is preferably in a range of 3 to 15%, more preferably 5% or more and 15% or less.

(Manufacture of Supporting Substrate)

Preferred manufacturing processes for the supporting substrate and the composite substrate in the invention will be described below by way of example.

Figure 4A:
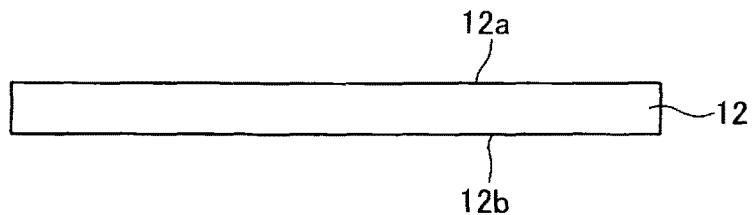
FIG. 4(a) shows a blank substrate 12 made of ceramic.

First, as shown in FIG. 4(a), a blank substrate 12 comprised of the oriented ceramic is prepared. Each of a surface 12a and a bottom surface 12b of the blank substrate 12 may be a polished surface, or a sintered surface (as-fired surface).

The oriented ceramic can be fabricated, for example, by the method described in Patent Document 2.

Specifically, first, raw material powder comprised of plate-shaped grains with a specific crystal face exposed is prepared. For example, the raw material powder may be commercially available powder (e.g., SERATH™ (Al$_2$O$_3$), manufactured by Kinsei Matec Co., Ltd.), or may be fabricated by other known methods.

A description will be given of one example of a fabricating method of the raw material powder comprised of the plate-shaped grains. First, a thin ceramic sheet is fabricated. This sheet is obtained by forming raw material grains in the form of sheet, for example, having a thickness of 15 μm or less and sintering the formed material, to roughly grow crystal grains along a sheet surface. In this way, the growth of crystal grains is more promoted in the direction of the sheet surface, so that the crystal grains can grow to be flat plate-shaped ones having a larger aspect ratio with a specific crystal face aligned with the sheet surface (in the oriented state). These crystal grains are pulverized to an appropriate grain size by ball milling or the like, whereby the powder comprised of the plate-shaped grains with the specific crystal face exposed can be fabricated. Raw materials suitable for use in the ceramic sheet can include an oxide, a hydroxide, a carbonate, a sulfate, a nitrate of a target component, and the like. However, the main raw material for use in the ceramic sheet is preferably the oxide, or the carbonate. In pulverization of the sheet, the grain size is preferably set according to the thickness of the sheet. Specifically, a median diameter (D50) of the raw material is preferably set to not less than 2% nor more than 60% of the thickness of the sheet. If the median diameter is 2% or more of the sheet thickness, the pulverization process is easily performed. If the median diameter is 60% or less, the sheet thickness is easily adjusted. The grain size is a value measured by dispersing grains into a dispersion medium (e.g., an organic solvent, water, etc.,) using a laser diffraction-scattering particle size distribution measuring device. The pulverization of raw materials is preferably wet pulverization, and for example, a ball mill, a bead mill, a trommel, an attritor, etc., may be used.

The raw material powder comprised of the plate-shaped grains obtained by the above-mentioned method is formed to produce a preformed sheet. The forming methods can include, for example, a doctor blade method using a slurry containing plate-shaped grains, and extrusion method using a green body containing the plate-shaped grains. In use of the doctor blade method, a ceramic sheet may be fabricated by applying a slurry to a flexible plate (for example, an organic polymer plate, such as a PET film), drying and solidifying the applied slurry to form a preform, and then peeling the preform from the plate. When preparing the slurry or the green body before the forming process, the flat plate-shaped grains may be dispersed in an appropriate dispersion medium, and a binder, a plasticizer, etc., may be added to the medium as needed. The slurry is preferably prepared to have a viscosity of 5000 to 50000 cP, and preferably defoamed under a reduced pressure.

A thickness of the preformed sheet is preferably 300 μm or less, more preferably 200 μm or less, even more preferably 100 μm or less, and most preferably 50 μm or less. The thickness of the preformed sheet is preferably set to 10 μm or more.

Then, the preformed sheet is sintered. At this time, a plurality of the preformed sheets may be laminated. During the laminating process, isostatic pressing (CIP) is preferably performed. To improve the adhesiveness between the sheets, the isostatic pressing may be performed in warm water of 100° C. or less (WIP). A sintering temperature in the sintering process may be one that can produce balanced crystals, or may be set higher than this temperature. In the case of the preform including binder etc., a heat treatment may be performed for the main purpose of degreasing before the sintering process. At this time, the temperature for the degreasing is set to a temperature (e.g., 400 to 600° C.) enough to thermally decompose organic materials, including at least a binder etc.

The oriented ceramic can also be fabricated, for example, by the method using the magnetic field as described in Patent Document 5.

(Polishing)

Figure 4B:
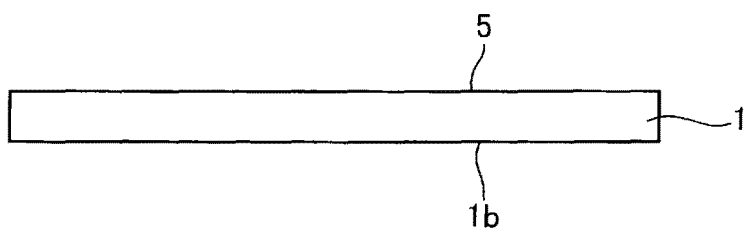
FIG. 4(b) shows a base substrate 1 obtained by polishing the blank substrate 12.
Figure 4C:
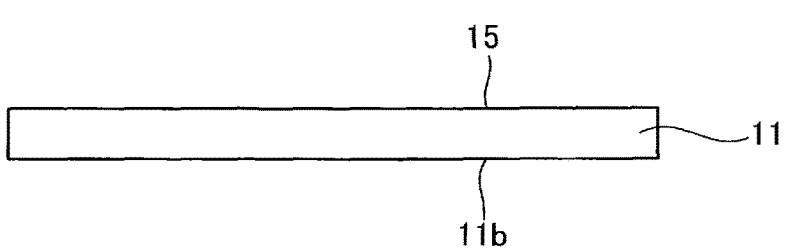
FIG. 4(c) shows a supporting substrate 11 obtained by further polishing the base substrate 1.

For example, the surface 12a of the blank substrate 12 shown in FIG. 4(a) is polished to obtain a base substrate 1 shown in FIG. 4(b). The base substrate has a polished surface 5 and the non-polished bottom surface 1b. Then, the polished surface 5 is subjected to precise polishing, whereby each crystal grain is ground along the plane and as a result the polished crystal grains with their flat surfaces are exposed at the surface. The polished crystal grains have smooth surfaces. In this way, the supporting substrate 11 is obtained. The supporting substrate has a polished surface 15 to be used for bonding with the functional substrate. The supporting substrate 11 has a bottom surface 11b.

Figure 4D:
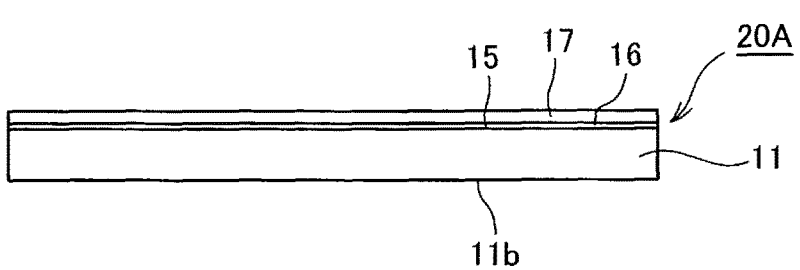
FIG. 4(d) shows a composite substrate 20A obtained by bonding a functional substrate 17 onto the supporting substrate 11 via a bonding layer 16.
Figure 4E:
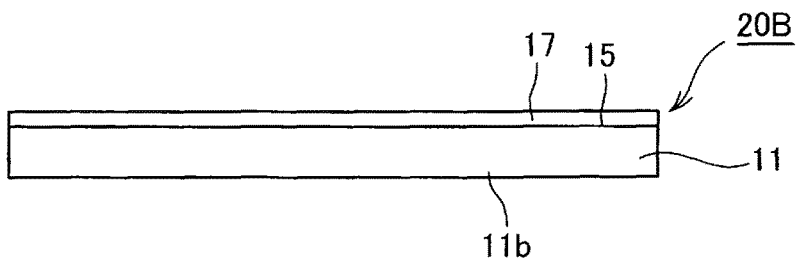
FIG. 4(e) shows a composite substrate 20B obtained by bonding the functional substrate 17 directly onto the supporting substrate 11.

After obtaining the supporting substrate 11, a functional substrate 17 can be bonded to the surface 15 of the supporting substrate 11. In a composite substrate 20A shown in FIG. 4(d), the functional substrate 17 is bonded onto the surface 15 of the supporting substrate 11 via a bonding layer 16. In a composite substrate 20B shown in FIG. 4(e), the functional substrate 17 is bonded directly onto the surface 15 of the supporting substrate 11 without the bonding layer 16. In either composite substrate, the surface of the supporting substrate 11 is smooth as viewed microscopically, and thus can enhance the bonding strength with the functional substrate.

In a preferred embodiment, a microscopic center-line average surface roughness Ra of the surface of the supporting substrate is 30 nm or less. If the center-line average surface roughness is large, the bonding strength with the functional layer is reduced. From the viewpoint of the invention, it is further preferably 25 nm or less. This is a value obtained by taking an image of an exposed surface of each crystal grain appearing at the surface of a specimen by means of an atomic force microscope, and performing calculation as will be described later.

At a polishing stage, the following steps can be exemplified.

That is, a diamond slurry (with an average grain size of 0.5 to 3 μm) is dropped on a metal surface plate (Sn, Cu), and the surface plate is rotated. The substrate is put on the metal surface plate with its surface in contact with the metal surface plate, and polished while pressure is being applied to the substrate.

In a preferred embodiment, a colloidal silica slurry (with an average grain size of 20 to 80 nm) is dropped on a polishing pad, and then the pad is rotated. The substrate is put on the pad with the surface of the substrate material in contact with the pad, and polished while pressure is being applied to the substrate.

A rigid pad is preferably a foamed polyurethane pad, or a urethane impregnated non-woven fabric pad. The foamed urethane includes a prepolymer of urethane, a curing agent, and a foaming agent. Urethane resin suitable for use is ether-based urethane, and the curing agent for use is diamine from the viewpoint of resistance to water and chemicals. A foaming rate of the used foamed urethane is 0.4 to 1.0 g/cm$^3$ depending on the applications. In addition to the pad made of urethane resin, a pad made of epoxy resin is also developed for use.

Main varieties of fibers of non-woven fabrics in the non-woven fabric pad are rayon, nylon, polyester, acrylic, polypropylene, and the like. Such a non-woven fabric is impregnated with urethane resin to make a mixture of the non-woven fabric and the polyurethane resin.

In a stage of applying a mirror finish by use of the rigid pad, the colloidal silica slurry can be used to polish the substrate.

(Bonded Form)

Techniques suitable for use in bonding between the supporting substrate and the functional substrate include, but not limited to, for example, direct bonding by means of surface activation, and a substrate bonding technique using an adhesive layer.

In the direct bonding, a low-temperature bonding technique through surface activation is suitably used. After the surface activation is performed using Ar gas in vacuum of about 10$^{-6}$ Pa, a single crystalline material, such as Si, can be bonded to a polycrystalline material via an adhesive layer, such as SiO$_2$, at ordinary temperature.

Figure 5:
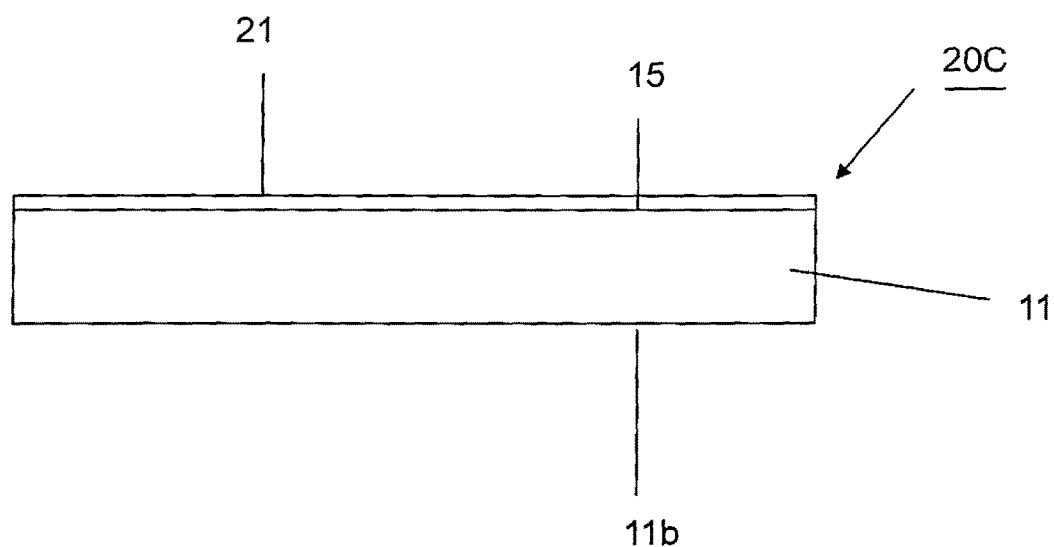
FIG. 5 shows a composite substrate 20C obtained by separating most of the functional substrate from the supporting substrate 11 while leaving a part (thin layer) 21 of the functional substrate (made of, e.g., GaN) on the supporting substrate 11.
Figure 6:
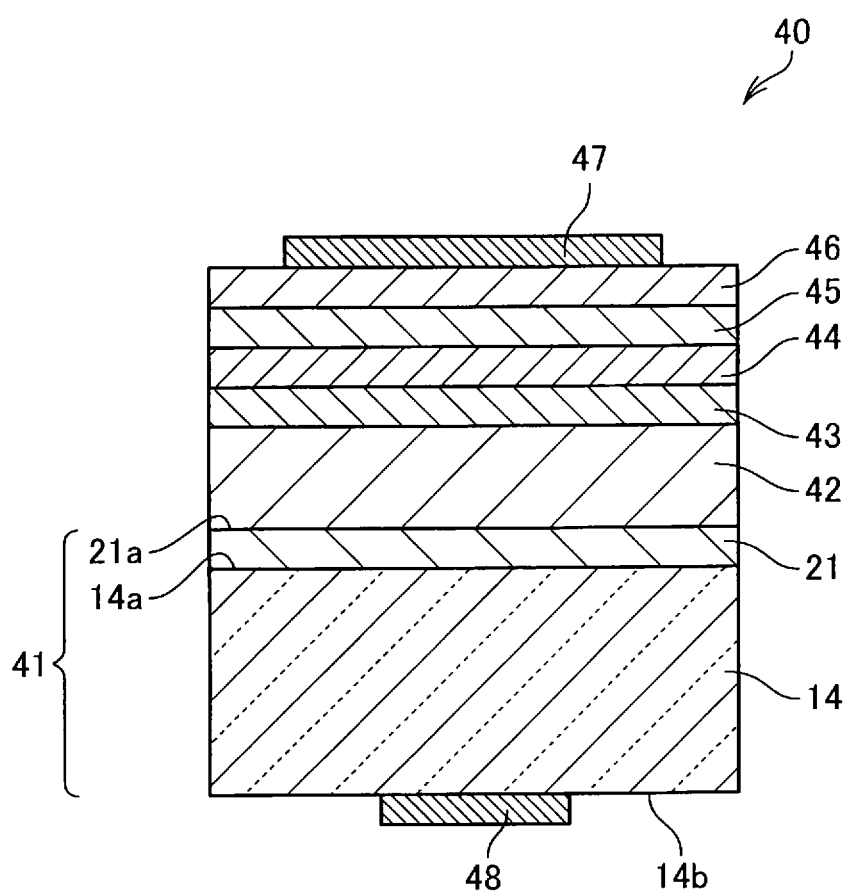
FIG. 6 is a cross-sectional view schematically showing an example of the structure of a light-emitting element when a supporting substrate has electrical conductivity.

FIG. 5 shows a composite substrate 20C obtained by separating the supporting substrate 11 while leaving a part (thin layer) 21 of the functional substrate (made of, e.g., GaN) on the supporting substrate 11. FIG. 6 is a cross-sectional view schematically showing an example of the structure of a light-emitting element when the supporting substrate is conductive.

In the composite substrate 20C shown in FIG. 5, a functional thin layer 21 is bonded to the bonding surface 15 of the supporting substrate 11.

A light-emitting element 40 shown in FIG. 6 includes a composite substrate 41 obtained by cutting the composite substrate 20C shown in FIG. 5 into chips. The composite substrate 41 includes a supporting substrate 14, and the GaN thin layer 21 provided at a bonding surface 14a of the supporting substrate 14.

The light-emitting element 40 includes nitride-based compound semiconductor layers, namely, an n-type GaN layer 42 and an n-type AlGaN layer 43 that are laminated in this order over a surface 21a of the GaN thin layer 21. The n-type GaN layer 42 is a layer that grows directly on the GaN thin layer 21 at a high growth temperature of not less than 900° C. nor more than 1150° C. The light-emitting element includes a light emission layer 44 provided over the n-type AlGaN layer 43. The nitride-based compound semiconductor layers, namely, a p-type AlGaN layer 45 and a p-type GaN layer 46 are disposed over the light emission layer 44.

The light emission layer 44 can be comprised of a single layer including In, or can have a quantum well structure. When necessary, the quantum well structure can include well layers and barrier layers alternately arranged. The well layer can be comprised of a nitride-based compound semiconductor containing In, e.g., InGaN, etc., and the barrier layer can be comprised of InGaN, GaN, etc., having a larger bandgap energy than that of the well layer. The light emission wavelength of the light emission layer 44 is controlled by the bandgap or an In composition of the well layer, the thickness of the well layer, and the like. When the surface 21a of the GaN thin layer 21 is set as a non-polar surface or a semi-polar surface, the light emission layer 44 can have an In composition emitting green light having a peak wavelength in a range of not less than 500 nm nor more than 550 nm.

The light-emitting element is provided with an anode electrode 47 and a cathode electrode 48. The anode electrode 47 is provided over the p-type GaN layer 46. The anode electrode is comprised of metals, for example, of Ni/Au/Al/Au laminated in this order. An ohmic contact is achieved between the anode electrode 47 and the p-type GaN layer 46. The cathode electrode 48 is provided at a back surface 14b of the conductive supporting substrate 14. The cathode electrode 48 is comprised of metals, for example, of Ti/Al/Au laminated in this order. An ohmic contact is achieved between the cathode electrode 48 and the supporting substrate 14.

Figure 7:
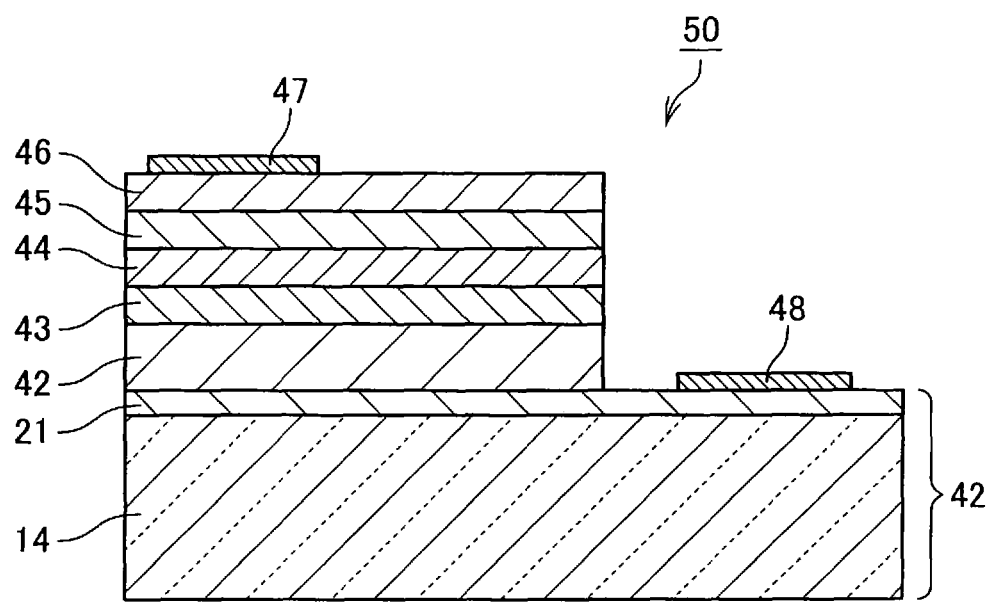
FIG. 7 is a cross-sectional view showing an example of the structure of a light-emitting element when a supporting substrate does not have electrical conductivity.

FIG. 7 is a cross-sectional view showing an example of the structure of a light-emitting element 50 when the supporting substrate 43 does not have electrical conductivity. The same part in FIG. 7 as that in FIG. 6 is denoted by the same reference character, and its description thereof will be omitted. A composite substrate 42 is illustrated.

In this example, since the supporting substrate 43 does not have electrical conductivity, the anode electrode 47 and the cathode electrode 48 are disposed on the same side with respect to the supporting substrate. That is, the anode electrode 47 is provided over the p-type GaN layer 46, and the cathode electrode 48 is provided over the thin layer 21.

The following method can be used as a method for separating most of the functional substrate from the supporting substrate while leaving a part (thin layer) of the functional substrate on the supporting substrate. First, ion implantation is performed on the surface of the functional substrate to thereby bond the surface of the functional substrate to the main surface of the supporting substrate. Various methods can be proposed as the bonding method. For example, both substrates may be pressed against each other under an ultrahigh vacuum, or may be heated at about 200° C. in a plasma atmosphere under a low vacuum to be bonded together. After being bonded together in this way, these substrates are heated at a higher temperature (of, e.g., 300° C. to 500° C.) to thereby start peeling of an area near a damaged layer of the functional substrate caused by the ion implantation. In this way, only a part (thin layer) of the functional substrate can be left over the supporting substrate, and the other part of the functional substrate can be separated from the supporting substrate. The separated other part of the functional substrate can be used again as a substrate for formation of a thin layer by the surface treatment.

(Adhesive Layer)

Examples of suitable materials for the adhesive layer can include $SiO_2$, $Al_2O_3$, and $Si_3N_4$, in addition to resin for the adhesion.

Materials for the organic adhesive layer adapted for bonding between the supporting substrate and the functional layer are not limited, but preferably include acrylic-based resin, and epoxy-based resin.

Methods for forming the adhesive layer are not limited, but can include, for example, printing, and spin coating.

EXAMPLES

Example 1

ZnO, m-plane Orientation

Plate-shaped primary particles made of ZnO were fabricated in the following way.

$Zn(NO_3)_2$ solution having a molar concentration of 0.1 M was prepared using zinc nitrate hexahydrate, manufactured by Kanto Chemical Co., Inc. Further, NaOH solution having a molar concentration of 0.1 M was prepared using sodium hydroxide, manufactured by Sigma-Aldrich Co. LLC. The $Zn(NO_3)_2$ solution was mixed into the NaOH solution at a volume ratio of 1:1, and held at 80° C. for six hours while being stirred, thereby producing a precipitate. The precipitate was washed with ion-exchange water three times and then dried, thereby producing spherical secondary particles, each being formed by agglomeration of the plate-shaped ZnO primary particles.

Then, the secondary particles were subjected to ball mill crushing for three hours by means of $ZrO_2$ balls having a 2 mm in diameter using ethanol as a solvent, whereby the secondary ZnO particles were pulverized into plate-shaped primary particles having an average grain size of 0.6 μm.

To 100 parts by weight of the plate-shaped primary ZnO particles thus obtained, were added 9 parts by weight of a binder (polyvinyl butyral: product number BM-2, manufactured by Sekisui Chemical Co., Ltd.), 4.5 parts by weight of a plasticizer (DOP: Di(2-ethylhexyl)phthalate, manufactured by Kurogane Kasei Co., Ltd.), 3 parts by weight of a dispersant (product name Rheodol SP-030, manufactured by Kao Corporation), and a dispersion medium (2-ethylhexanol), and mixed together. The amount of the dispersion medium was adjusted to set the viscosity of the slurry at 12000 cP. The slurry prepared in the way described above was formed over a PET film in the form of sheet by the doctor blade method such that the dried film had a thickness of 20 μm. The thus-obtained tape was cut into pieces having a circular shape of 140 mm in diameter. Then, 50 pieces were laminated on each other, and put on an Al plate having a thickness of 10 mm, followed by packing under vacuum. The vacuum packing was performed by isostatic press in a hot water at 85° C. under a pressure of 100 kgf/cm², thereby fabricating a disk-shaped preform.

The thus-obtained preform was put in a degreasing furnace and degreased under the conditions of 600° C.×20 hours. Then, the degreased body obtained in the above manner was sintered in the atmosphere at normal pressure under the conditions of 1300° C.×5 hours, thereby producing a disk-shaped ZnO sintered body (blank substrate 12: see FIG. 4(a)).

The blank substrate 12 obtained was ground with a fixed whetstone and prepared to have a thickness of 0.5 mm. Then, the bonding surface of the substrate was polished using diamond abrasive grains having a size of about 0.5 μm and a tin surface plate. Further, the bonding surface was polished using the colloidal silica slurry and a rigid urethane pad.

To ascertain a difference in height between crystal grains at the bonding surface 15 of the supporting substrate 11 obtained, the center-line average surface roughness Ra in a field of view of 300 μm×300 μm was evaluated using a three-dimensional light interference roughness meter.

To determine the orientation degree of the supporting substrate 11 obtained, the orientation degree of the bonding surface 15 was measured by X-ray diffraction (XRD). An XRD profile obtained when irradiating the bonding surface of the substrate with X rays was measured using the XRD device (manufactured by Rigaku Corporation, product name "RINT-TTRIII"). The orientation degree was calculated by a Lotgering method, by using all diffraction peaks appearing in a range of diffraction angles 2θ of 30 to 45° in use of CuKα ray (having a wavelength of 1.5418 Å) as the X-ray. Note that if a diffraction peak of a crystal face to be measured did not appear in the above-mentioned angle range, all other diffraction peaks appearing within the above angle range and a diffraction peak of the crystal face to be measured were used to calculate the orientation degree by the Lotgering method. The crystal face to be measured in this experimental example was (100) plane, and its orientation degree was calculated by the following formula. As a result, the orientation degree of the (100) plane in this experimental example was 0.71.

$$p_0 = \frac{I_0(100)}{I_0(100) + I_0(002) + I_0(101)} \qquad \text{[Formula 1]}$$

$$p = \frac{I_s(100)}{I_s(100) + I_s(002) + I_s(101)}$$

($I_0$(hkl) and $I_s$(hkl) are diffraction intensities (integral values) of (hkl) faces of ICDD No. 361451 and an sample, respectively)

The average crystal grain size of the bonding surface 15 of the supporting substrate 11 was measured by the method below.

The bonding surface 15 was etched for 10 seconds using nitric acid having a molar concentration of 0.3 M to emphasize grain boundaries, and then an image was taken with the electron scanning microscope. A vision range was set in such a manner that when drawing three straight lines in parallel within the vision range, all these lines intersect 10 to 30 grains. Regarding all grains intersecting the three straight lines, the lengths of line segments within the individual grains were averaged to determine an average value, which was then multiplied by 1.5 to obtain an average grain size of the bonding surface.

An aspect ratio of the crystal grain at the section of the supporting substrate was measured by the following method.

A specimen measuring about 10 mm square was cut out from the supporting substrate, and its surface perpendicular to the bonding surface was polished and then etched for 10 seconds with nitric acid having a molar concentration of 0.3 M. Then, an image of the polished surface was taken with the electron scanning microscope. Here, the vision range was set in such a manner that when drawing three straight lines in parallel to the bonding surface within the vision range, all these lines intersect 10 to 30 grains. Regarding all particles intersecting three straight lines drawn in parallel to the bonding surface, the lengths of line segments within the individual grains were averaged to determine an average value, which was defined as $a_1$. Likewise, regarding all grains intersecting three straight lines drawn perpendicularly to the bonding surface, the lengths of line segments within the individual grains were averaged to determine an average value, which was defined as $a_2$. A ratio of $a_1$ to $a_2$ ($a_1/a_2$) was set as the aspect ratio.

Example 2

ZnO, m-plane Orientation

As compared to Example 1, the amount of dispersion medium was decreased to set the viscosity of the slurry to 24000 cP. Further, the sintering temperature was set to 1400° C. Regarding other points, it was set to the same as Example 1. As a result, the (100)-orientation degree of the supporting substrate was increased to 0.83. Note that other indexes were shown in Table 1.

Example 3

ZnO, m-plane Orientation

As compared to Example 1, the amount of dispersion medium was decreased to set the viscosity of the slurry to 42000 cP. Further, the sintering temperature was set to 1450° C. Regarding other points, it was set to the same as Example 1. As a result, the (100)-orientation degree was increased to 0.90. Note that other indexes were shown in Table 1.

Example 4

ZnO, c-plane Orientation 1730 g of zinc sulfate heptahydrate (manufactured by Kojundo Chemical Laboratory Co., Ltd.) and 4.5 g of sodium gluconate (manufactured by Wako Pure Chemical Industries, Ltd.) were dissolved in 3000 g of ion-exchange water. This solution was poured into a beaker, and then heated to 90° C. while being stirred with a magnetic stirrer. To the solution, was dropped 490 g aqueous ammonia having a concentration of 25% by means of a micro tube pump while the solution is stirred with its temperature kept at 90° C. After the end of dropping, the solution was stirred for four hours with its temperature kept at 90° C., and then was allowed to stand. The precipitate was separated from the solution by filtering, further washed three times with ion-exchange water, and dried to produce white powdery zinc oxide precursor. 100 g of the obtained zinc oxide precursor was placed on a zirconia setter and calcined in an electric furnace in the atmosphere, thereby producing 65 g of plate-shaped porous zinc oxide powder. A temperature schedule for the calcination included raising the temperature of the powder from room temperature up to 900° C. at a rate of temperature increase of 100° C./h, then holding the powder at 900° C. for 30 minutes, and thereafter naturally cooling it. The plate-shaped zinc oxide powder obtained in this way was pulverized by ball milling using $ZrO_2$ balls, to have an average grain size of 1.0 μm.

To 100 parts by weight of the zinc oxide plate-shaped grains obtained in the above-mentioned way, were added and mixed 15 parts by weight of a binder (polyvinyl butyral: product number BM-2, manufactured by Sekisui Chemical Co., Ltd.), 6.2 parts by weight of a plasticizer (DOP: di(2-ethylhexyl) phthalate, manufactured by Kurogane Kasei Co., Ltd.), 3 parts by weight of a dispersant (product name: Rheodol SP-030, manufactured by Kao Corporation), and a dispersion medium (2-ethylhexanol). The amount of the dispersion medium was adjusted to set the viscosity of the slurry to 10000 cP. The slurry prepared in this way was formed over a PET film in the form of sheet by the doctor blade method such that the dried film has a thickness of 20 μm.

The following steps were set to the same as those in Example 1.

To determine the orientation degree of the supporting substrate obtained, the orientation degree of the (002) plane at the polished surface, which was a crystal face to be measured in this experimental example, was measured by the XRD. An XRD profile, obtained in the case of applying X rays to the disk-shaped ZnO bonding surface, was measured by using the XRD device (manufactured by Rigaku Corporation, product name "RINT-TTRIII"). The (002)-orientation degree was calculated by the following formula.

$$\text{(002) orientation degree (\%)} = \frac{P - P_0}{1 - P_0} \times 100 \quad \text{[Formula 2]}$$

$$p_0 = \frac{I_0(002)}{I_0(100) + I_0(002) + I_0(101)}$$

$$p = \frac{I_s(002)}{I_s(100) + I_s(002) + I_s(101)}$$

($I_0$(hkl) and $I_s$(hkl) are diffraction intensities (integral values) of (hkl) faces of ICDD No. 361451 and an sample, respectively)

Example 5

$Al_2O_3$, c-plane Orientation

A tape laminate was fabricated by laminating 50 tapes, each having a thickness of 20 μm, using a plate-shaped $Al_2O_3$ as a raw material, manufactured by Kinsei Matec Co., Ltd. (grade 00610) in the same way as Example 1. Degreasing was performed in the same manner as Example 1, and the hot pressing was performed using a graphite mold in nitrogen gas under conditions of 1700° C.×4 hours, thereby fabricating a sintered body. Thereafter, the bonding surface was processed in the same way as Example 1, thereby fabricating a supporting substrate.

To determine the orientation degree of the supporting substrate obtained, the orientation degree of the (006) plane at the polished surface, which was a crystal face to be measured in this experimental example, was measured by the XRD. An XRD profile, obtained when applying X rays to the disk-shaped $Al_2O_3$ bonding surface, was measured by using the XRD device (manufactured by Rigaku Corporation, product name "RINT-TTRIII"). The (006)-orientation degree was calculated by the following formula.

$$(006) \text{ orientation degree } (\%) = \frac{P - P_0}{1 - P_0} \times 100 \quad \text{[Formula 3]}$$

$$p_0 = \frac{I_0(006)}{I_0(104) + I_0(110) + I_0(006) + I_0(113)}$$

$$p = \frac{I_s(006)}{I_s(104) + I_s(110) + I_s(006) + I_s(113)}$$

($I_0$(hk1) and $I_s$(hk1) are diffraction intensities (integral values) of (hk1) faces of ICDD No. 461212 and a sample, respectively.)

Comparative Example 1

ZnO, Non-orientation

A supporting substrate was fabricated using commercially available ZnO powder (Zinc Oxide I having an average grain size of 0.6 μm, manufactured by Seido Chemical Industry Co., Ltd.) in the same way as Example 1.

Comparative Example 2

ZnO, c-plane Orientation, High Aspect Ratio

The average grain size after pulverization with the ball mill was set to 3.0 μm. A supporting substrate was fabricated in the same way as Example 4 except for the above-mentioned point.

TABLE 1

|  | Orientation face and degree [%] | Average grain size bonding face [μm] | Grain Aspect ratio | Bonding face Ra [nm] |
|---|---|---|---|---|
| Example 1 | ZnO(100) 71 | 13 | 1.2 | 22 |
| Example 2 | ZnO(100) 83 | 40 | 1.4 | 15 |
| Example 3 | ZnO(100) 90 | 75 | 1.5 | 10 |
| Example 4 | ZnO(002) 85 | 5 | 2.3 | 20 |
| Example 5 | Al$_2$O$_3$(006) 93 | 18 | 2.0 | 19 |
| Com. Exp. 1 | (orientation face is not observed) | 15 | 1.1 | 65 |
| Com. Exp. 2 | ZnO(002) 90 | 8 | 5.1 | >1000 (Grain removal occurs at a high frequency) |

In each of Examples of the invention, the microscopic center-line average surface roughness of the bonding surface was able to be reduced, so that the supporting substrate obtained was suitable for use in bonding as it did not cause the falling of grains and the occurrence of cracks.

In a comparative example 1, the oriented ceramic was not used. The microscopic roughness Ra of the bonding surface became large. It could be understood that it was not suitable for use in bonding with the functional substrate.

In a comparative example 2, the orientation degree of the supporting substrate was increased, and the rate of falling of the grains became very large. Thus, it could be understood that it was not able to be used for bonding with the functional substrate.

The invention claimed is:

1. A supporting substrate for a composite substrate, said supporting substrate comprising a ceramic and having a polished surface for use in bonding:
   wherein the supporting substrate has a thickness of 100 μm or more,
   wherein an orientation degree of said ceramic at said polished surface is 50% or higher;
   wherein an aspect ratio of crystal grains forming said supporting substrate is 2.5 or less; and
   wherein an average surface roughness of said polished surface of said supporting substrate is 30 nm or less.

2. The supporting substrate for a composite substrate of claim 1, wherein an average crystal grain size of said ceramic is 100 μm or less.

3. The supporting substrate for a composite substrate of claim 1, wherein an average crystal grain size of said ceramic is 2 μm or more.

4. The supporting substrate for a composite substrate of claim 1, wherein said ceramic comprises alumina, cordierite or zinc oxide as a principal component.

5. The supporting substrate for a composite substrate of claim 1, wherein said polished surface of said supporting substrate comprises a non-polar surface.

6. The composite substrate of claim 1, wherein the thickness of the supporting substrate is 500 μm or less.

7. The composite substrate of claim 1, wherein the aspect ratio of the crystal grains is 1.5 or less.

8. A composite substrate, comprising:
   said supporting substrate of claim 1; and
   a functional layer bonded to said polished surface of said supporting substrate directly or via a bonding layer, said functional layer comprising a semiconductor, a piezoelectric material or a dielectric material.

9. The composite substrate of claim 8, wherein said functional layer comprises a piezoelectric single crystal and comprises a propagation substrate transferring an acoustic wave.

10. The composite substrate of claim 8, wherein said functional layer comprises a single-crystal silicon.

11. The composite substrate of claim 8, wherein said functional layer comprises a GaN-based semiconductor.

* * * * *